US012805083B2

(12) United States Patent
Visell et al.

(10) Patent No.: US 12,805,083 B2
(45) Date of Patent: Nov. 17, 2026

(54) STRETCHABLE ELECTRONIC DEVICE AND METHOD OF MAKING THE SAME

(71) Applicant: THE REGENTS OF THE UNIVERSITY OF CALIFORNIA, Oakland, CA (US)

(72) Inventors: Yon Visell, Goleta, CA (US); Shantonu Biswas, Santa Barbara, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 1045 days.

(21) Appl. No.: 17/798,325

(22) PCT Filed: May 7, 2021

(86) PCT No.: PCT/US2021/031280
§ 371 (c)(1),
(2) Date: Aug. 9, 2023

(87) PCT Pub. No.: WO2021/226449
PCT Pub. Date: Nov. 11, 2021

(65) Prior Publication Data

US 2023/0155090 A1 May 18, 2023

Related U.S. Application Data

(60) Provisional application No. 63/022,064, filed on May 8, 2020.

(51) Int. Cl.
*H10H 20/857* (2025.01)
*H10H 20/01* (2025.01)
(Continued)

(52) U.S. Cl.
CPC .......... *H10H 20/857* (2025.01); *H10H 20/01* (2025.01); *H10H 20/84* (2025.01);
(Continued)

(58) Field of Classification Search
CPC ...... H01L 25/167; H10H 20/01; H10H 20/84; H10H 20/034; H10H 20/0364;
(Continued)

(56) References Cited

U.S. PATENT DOCUMENTS

2016/0052131 A1* 2/2016 Lessing .................... B25J 15/12 361/679.01
2016/0356957 A1* 12/2016 Sawada .................. G02B 6/125
(Continued)

OTHER PUBLICATIONS

Biswas, et al., "Integrated Soft Optoelectronics for Wearable Health Monitoring", Advanced Materials Technologies 5.8 (Jun. 21, 2020): 2000347. Entire Document., Jun. 21, 2020, 24 pages.
(Continued)

*Primary Examiner* — Victor A Mandala
(74) *Attorney, Agent, or Firm* — Billion & Armitage

(57) ABSTRACT

A method of manufacturing a stretchable electronic device includes the steps of:
a) depositing a release layer on a temporary rigid substrate;
b) depositing a sacrificial layer on the release layer;
c) fabricating conductive traces and electrical contacts on top of the sacrificial layer;
d) mounting surface mount components (SMCs) to the electrical contacts;
e) depositing a first stretchable polymer layer over the conductive traces and SMCs to form a stretchable substrate;
f) separating the rigid substrate and release layer from the sacrificial layer and the stretchable substrate at an interface between the release layer and the sacrificial layer;
g) removing the sacrificial layer from the stretchable substrate; and
(Continued)

h) depositing a second stretchable polymer layer on a surface of the stretchable substrate exposed by removing the sacrificial layer.

18 Claims, 10 Drawing Sheets

(51) Int. Cl.
*H10H 20/84* (2025.01)
*H10W 90/00* (2026.01)

(52) U.S. Cl.
CPC .......... *H10W 90/00* (2026.01); *H10H 20/034* (2025.01); *H10H 20/0364* (2025.01)

(58) Field of Classification Search
CPC .. H10H 20/857; H10K 59/1201; H10K 71/80; H10K 59/131
See application file for complete search history.

(56) References Cited

U.S. PATENT DOCUMENTS

2017/0040306 A1 2/2017 Kim et al.
2017/0094774 A1* 3/2017 Elsherbini .............. H05K 1/028
2018/0114905 A1* 4/2018 Yu ...................... H10K 59/1201
2018/0366619 A1* 12/2018 Holbery ................. H05K 3/284
2019/0371730 A1* 12/2019 Maxey ................. G06K 19/025
2020/0027863 A1* 1/2020 Kleijnen ................... F21S 4/24
2020/0111978 A1* 4/2020 Kim ..................... H10D 86/411
2020/0161287 A1* 5/2020 Yoo .......................... G09F 9/301
2021/0013431 A1* 1/2021 Kawata .................... H05K 1/02
2021/0225961 A1* 7/2021 Sun ........................... G09F 9/30
2021/0320269 A1* 10/2021 Yu .......................... H10W 90/00
2022/0076983 A1* 3/2022 Marinov ............ B23K 26/0673
2023/0088187 A1* 3/2023 Sui ....................... H10K 50/844
257/40

OTHER PUBLICATIONS

Park, et al., "Millimeter Thin and Rubber-Like Solid-State Lighting Modules Fabricated Using Roll-to-Roll Fluidic Self-Assembly and Lamination", Advanced Materials 27.24 (May 12, 2015): 3661-3668. p. 3662 col. 1 para 3; p. 3664 col. 1 para 2; p. 3665 col. 1 para 2; p. 3665 col. 2 para 4; p. 3667 col. 2 para 4; Figure 1; Figure 2; Figure 4; Figure 5., May 12, 2015, 8 pages.
PCT/US2021/031280, "International Search Report and Written Opinion Received mailed Oct. 1, 2021", Oct. 1, 2021, 12 pages.

* cited by examiner

Side View 3D View

Side View 3D View

STRETCHABLE ELECTRONIC DEVICE AND METHOD OF MAKING THE SAME

CROSS-REFERENCE TO RELATED APPLICATION

This application is a National Stage Application of International Patent Application No. PCT/US2021/031280 filed May 7, 2021, which claims benefit of priority to U.S. Provisional Patent Application No. 63/022,064 filed on May 8, 2020, the entire disclosure of each of which is hereby incorporated by reference.

STATEMENT OF GOVERNMENT RIGHTS

This invention was made with United States Government support under Grant No. 1751348, awarded by the National Science Foundation (NSF). The United States Government has certain rights in this invention.

BACKGROUND

The present invention is directed to flexible and stretchable electronic devices and in particular to methods of making flexible and stretchable electronic devices.

Wearable monitoring devices are utilized in a growing number of applications. The electronics associated with these monitoring devices must be flexible and stretchable to comply with and conform to the body of the wearer. Typical electronic devices fabricated on a printed circuit board are too rigid for this type of application. Many flexible circuits cannot be stretched, preventing them from conforming to the body of the wearer. It would therefore be desirable to fabricate flexible and stretchable electronic devices that can be utilized on wearable devices.

DETAILED DESCRIPTION

According to some aspects, this disclosure is directed to electronic devices that are stretchable and flexible and to methods of making the same. In some embodiments, a microfabrication method is utilized to fabricate the flexible and stretchable electronic device, hereinafter referred to as the device. As used herein, the term "stretchable" means that the device is capable of being elongated along at least one axis, and preferably multiple axes. Further, as used herein, the term "flexible" means that the device is capable of bending along multiple axes, in contrast with typical flexible printed circuit boards (PCBs) which are capable of flexing along only a single axis. The method utilizes a substrate formed of a rigid material (e.g., silicon, glass, etc.) on which the device is temporarily disposed to fabricate conductive traces and contact pads on which surface mounted electrical components are mounted to be included in the device. In some embodiments, a release layer, e.g., polymethyl methacrylate (PMMA), is deposited on the substrate, followed by a sacrificial layer, e.g., polyimide (PI), which is then cured to provide a rigid carrier on which the remaining microfabrication steps can be carried out. Following fabrication of the electronic components on the temporary rigid substrate, the electronic components are coated with a flexible and stretchable polymeric material that serves as a flexible and stretchable substrate for the device. This is followed by detachment of the electronics and flexible and stretchable substrate from the temporary rigid substrate at the interface between the release layer and the sacrificial layer. The sacrificial layer is subsequently removed from the flexible and stretchable substrate by an etching process and another layer of flexible and stretchable polymer material is provided over the bottom of the device. The end product is an electronic device in a flexible and stretchable substrate that is well adapted for use as a wearable device. The method of fabricating the electronic device, in particular the temporary use of the rigid substrate, allows for the use of high-precision microfabrication techniques capable of providing the desired integration density while providing a flexible and stretchable substrate that is well-suited for applications such as health monitoring of a person wearing the device. The device has the ability to conform to curved surfaces and is therefore useful in a number of applications, including as a wearable device capable of conforming to the body of a medical patient or other user.

Figure 1A:
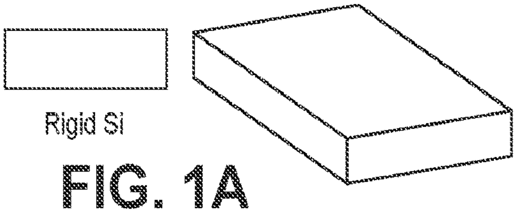
FIGS. 1a-1r are a diagram illustrating the microfabrication steps implemented to fabricate a flexible and stretchable electronic device according to some embodiments.
Figure 1B:
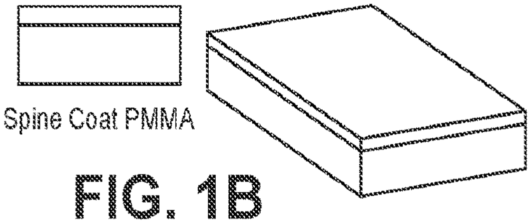
Figure 1C:
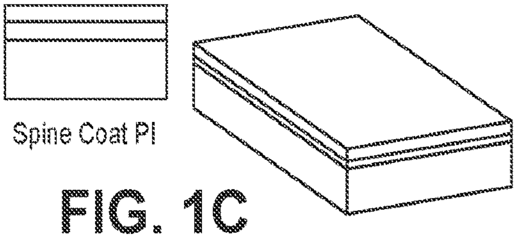
Figure 1D:
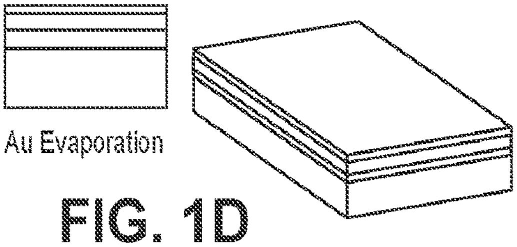
Figure 1E:
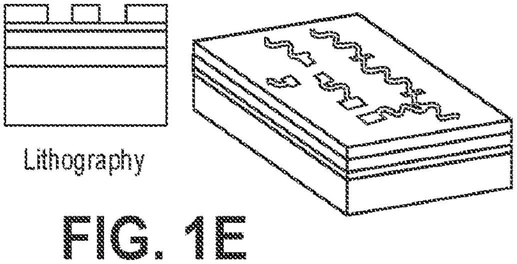
Figure 1F:
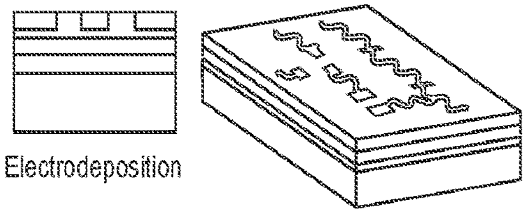
Figure 1G:
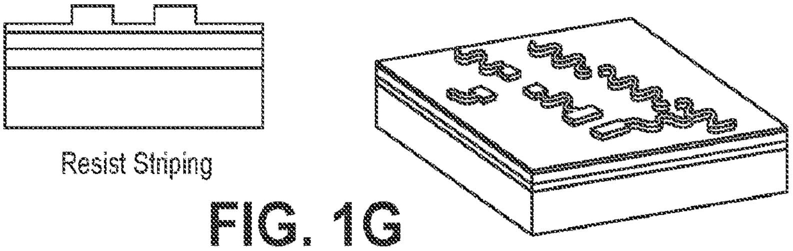
Figure 1H:
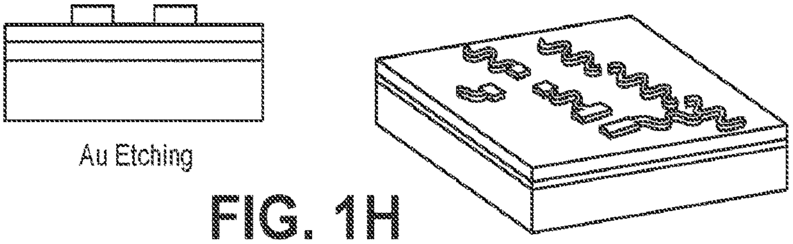
Figure 1I:
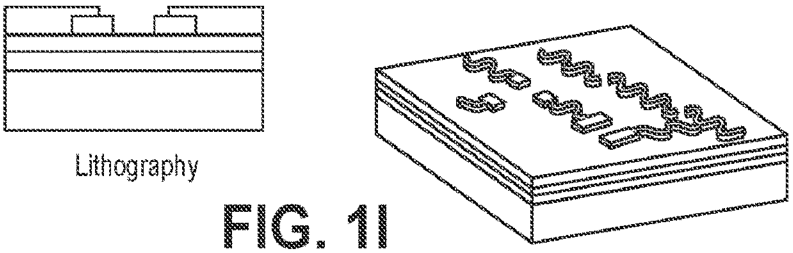
Figure 1J:
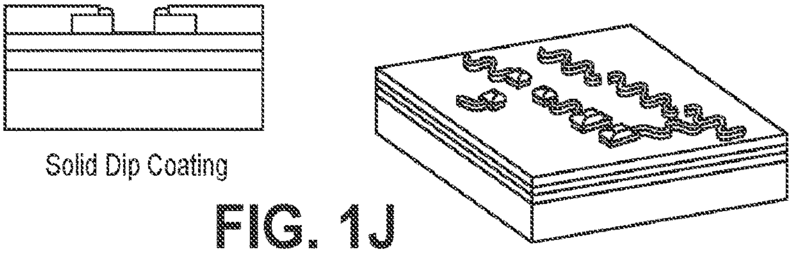
Figure 1K:
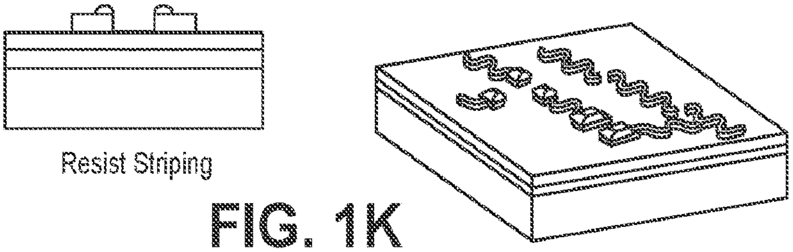
Figure 1L:
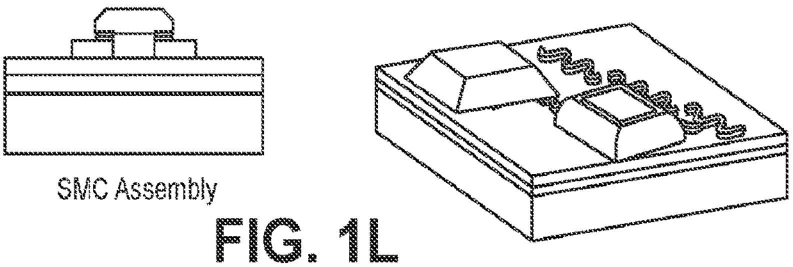
Figure 1M:
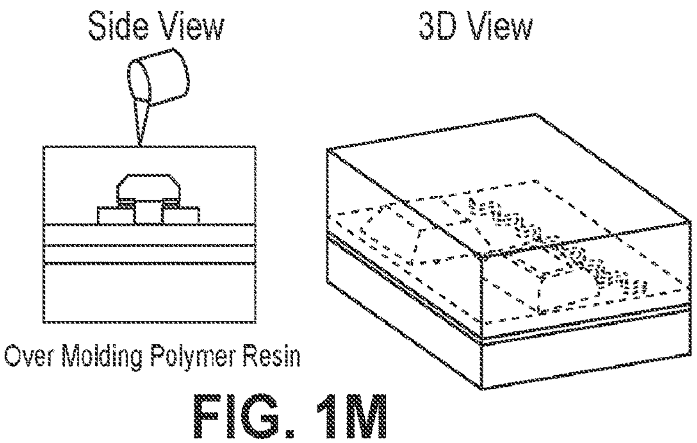
Figure 1N:
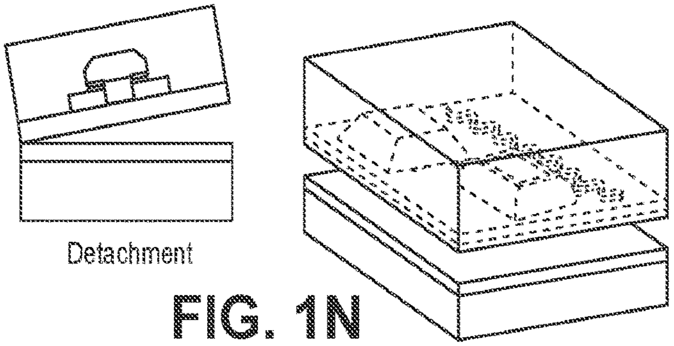
Figure 1O:
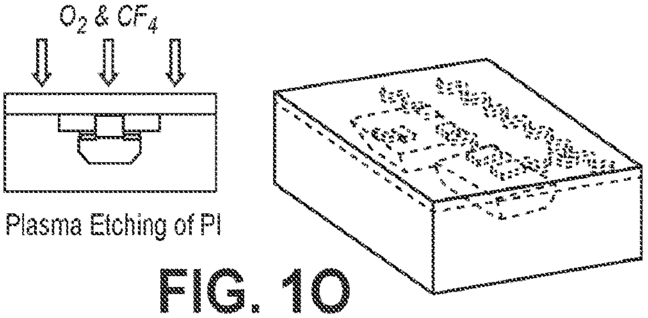
Figure 1P:
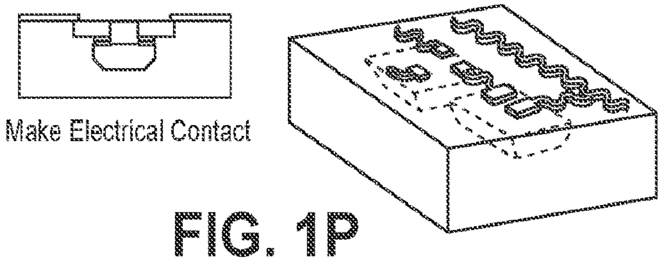
Figure 1Q:
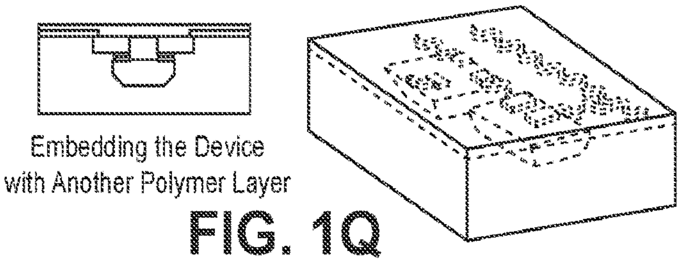
Figure 1R:
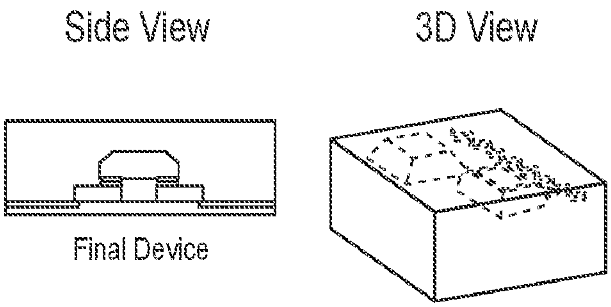

FIGS. 1a through 1r is a diagram illustrating the microfabrication steps of fabricating a stretchable and flexible electronic device. The method begins at the step shown in FIG. 1a with a temporary rigid substrate 100 such as a silicon substrate or glass substrate. In the step shown in FIG. 1b, a release layer 102 is deposited on the surface of the temporary rigid substrate 100. In some embodiments, the release layer 102 is polymethylmethacrylate (PMMA). In some embodiments, the release layer 102 is deposited onto the surface of the temporary rigid substrate 100 by a spin coat process and then heated at a desired temperature for a length of time (e.g., 180° C. for two minutes).

In the step shown in FIG. 1c, a sacrificial layer 104 is deposited on top of the release layer 102. In some embodiments, the sacrificial layer 104 is polyimide (PI). In some embodiments, the sacrificial layer 104 is deposited onto the surface of the release layer 102 by spin coating and then prebaking at 180° C. and subsequently fully curing in a convection oven at 300° C. under a flow of nitrogen.

In some embodiments, the adhesion between the release layer 102 and the sacrificial layer 104 is controlled to ensure the bond is sufficient to be maintained during subsequent fabrication steps but can be detached from each other to separate the rigid substrate from the device. Curing the release layer 102 and the sacrificial layer 104 allows the temporary substrate to act as a rigid carrier through the rest of the processing steps.

In the step shown in FIG. 1*d*, an initial metal layer 106 is deposited on top of the sacrificial layer 104 through a metallization process. In some embodiments, the initial metal layer 106 is deposited using electron beam evaporation. In some embodiments, the initial metal layer 106 is a gold (Au). In some embodiments, the initial metal layer 106 is utilized as a seed layer for subsequent electrodeposition techniques. In this embodiment, the seed layer may be relatively thin (e.g., approximately 400 nm thick). In some embodiments, plasma activation of the initial metal layer 106 is utilized to increase the surface adhesion of the initial metal layer 106 to the sacrificial layer 104.

In the step shown in FIG. 1*e*, photolithography techniques are utilized to pattern the initial metal layer 106. In some embodiments, this includes deposition of a mask layer 108 on the initial metal layer 106.

In the step shown in FIG. 1*f*, a thicker metal layer 110 is electrodeposited using the initial metal layer 106 as a seed layer.

In the step shown in FIG. 1*g*, the mask layer 108 is removed from the initial metal layer 106.

In the step shown in FIG. 1*h*, the initial metal layer 106 is removed (e.g., chemically etched) to expose metal contacts 112*a*, 112*b* and traces (not visible) in the desired pattern. In some embodiments, rather than a single layer of electrical traces and metal contacts 112*a*, 112*b*, the process may be repeated to fabricate a plurality of layers of electrical traces and/or contacts, which conductive layer (including electrical traces and/or contacts) separated by a flexible and stretchable insulative layer. In some embodiments, conductive vias are fabricated in the insulative layer located between the one or more conductive layers to provide a multi-layer flexible and stretchable circuit. In some embodiments the flexible and stretchable insulative layer is the same as the flexible and stretchable substrate described in more detail with respect the steps shown in FIGS. 1*m* through 1*q* and the deposition process may be essentially the same. In some embodiments, the flexible and stretchable insulative layer may also be patterned according to the desired via interconnects. In other embodiments, other material may be utilized between the layers of electrical traces and/or contacts but the material utilized should be both non-conductive (insulative) as well as flexible and stretchable. In some embodiments, one of the plurality of layers may include a conductive grounding layer. In some embodiments, the conductive grounding layer is fabricated utilizing a conductive polymer to provide the desired conductivity in combination with the desired flexibility and stretchability. At this stage in the process, the substrate is ready for mounting of surface mounted electrical components (SMCs) onto the metal contacts 112*a*, 112*b*. Depending on the application, a plurality of different types of SMCs may be utilized, including optical devices, electro-optical devices, electro-mechanical devices, etc. For example, in one application the SMCs include one or more active optical devices (e.g., light emitting diodes, lasers, etc.) and one or more optical sensors for measuring backscattered light.

In some embodiments, mounting of SMCs utilizes a lithography and dip coating process to deposit the solder at the desired location on the metal contacts 112*a*, 112*b*. In some embodiments, as shown in FIG. 1*i*, lithography techniques are utilized to deposit a mask layer 114. As shown in FIG. 1*i*, the mask layer 114 exposes a small portion of the metal contacts 112*a*, 112*b*.

In the step shown in FIG. 1*j*, the substrate is dip coated in a molten solder bath, which results in solder layers 116 being deposited onto exposed portions of the metal contacts 112*a*, 112*b*.

In the step shown in FIG. 1*k*, the mask layer 114 is removed by a stripping process, leaving the solder layer 116 positioned on the metal contacts 112*a*, 112*b* as desired.

In the step shown in FIG. 1*l*, a surface mounted device (SMC) 118 is placed onto the metal contacts 112*a*, 112*b* and the solder is heated causing it to reflow and allow self-assembly of the SMC 118 on the metal contacts 112*a*, 112*b*. At this point in the microfabrication process, the device can be electrically and mechanically tested. In some embodiments, these steps may utilize automated microfabrication techniques. For example, pick and place machines may be utilized to place the SMCs 118 on the desired contact pads. In addition, optical registration techniques may be utilized to verify placement of metal contacts 112*a*, 112*b* and/or SMCs 118.

Figure 3:
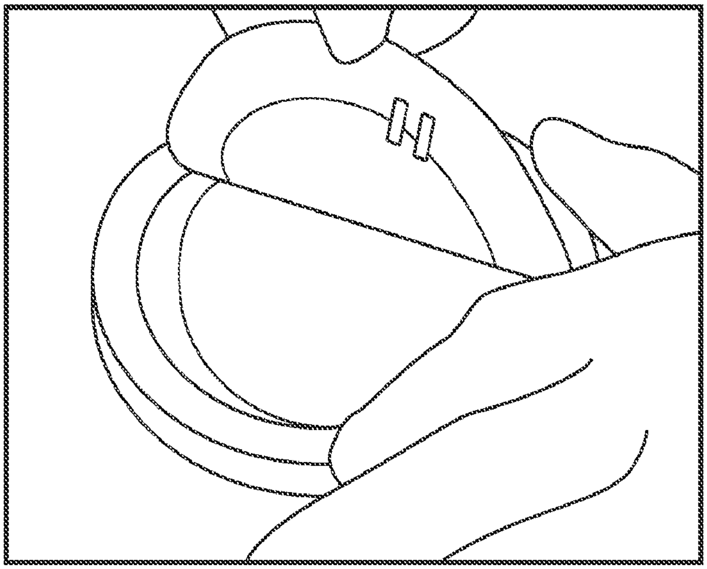
FIG. 3 is a perspective view of a flexible and stretchable electronic device being removed from a rigid substrate according to some embodiments.
Figure 4A:
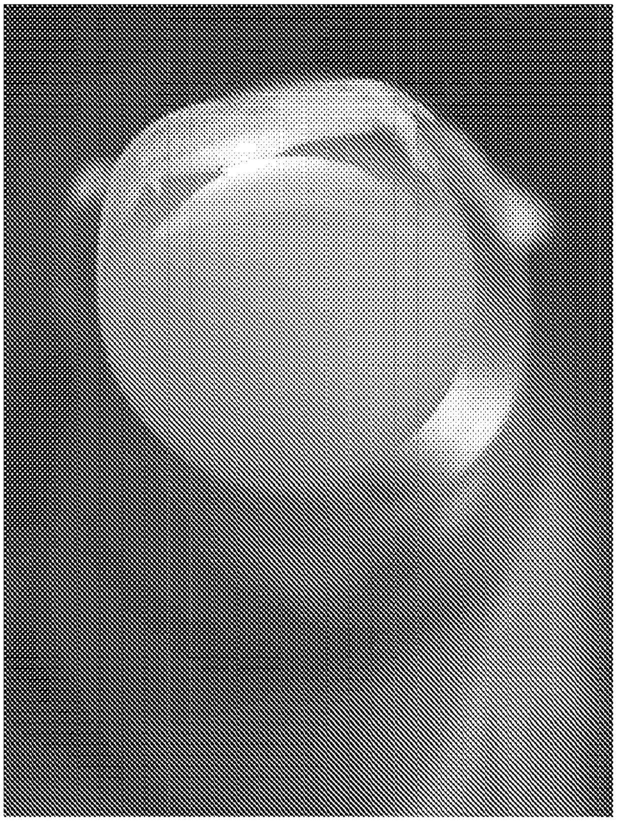
FIG. 4a is a perspective view of a flexible and stretchable electronic device being worn on a finger and used in a reflective mode according to some embodiments.
Figure 4B:
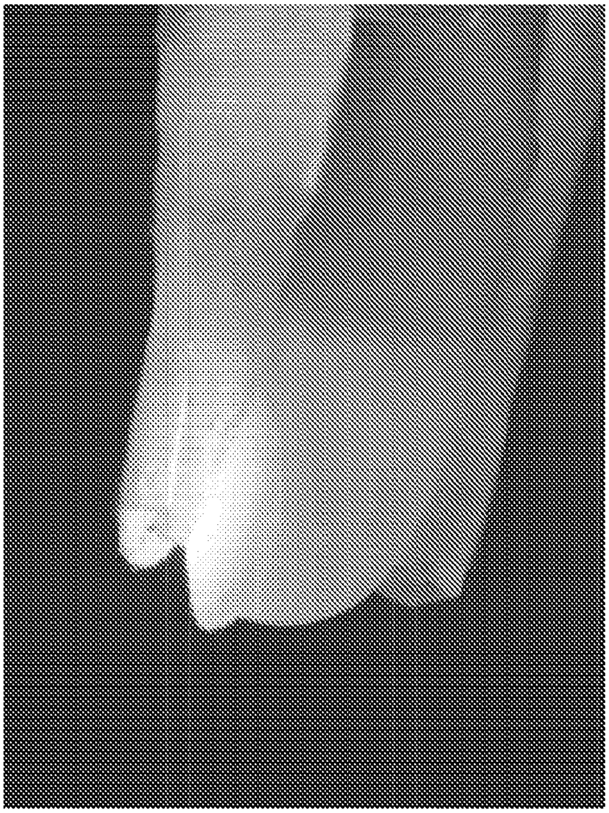
FIG. 4b is a perspective view of a flexible and stretchable electronic device being worn on a finger and used in a transmissive mode according to some embodiments.

In the steps shown in FIGS. 1*m* through 1*q* and in FIG. 3, the temporary rigid substrate is removed and replaced with a soft, compliant substrate 120. In some embodiments, the soft, compliant substrate 120 is clear, i.e., transparent, to allow optical signals to be transmitted to and from the SMCs 118. In some embodiments, in the step shown in FIG. 1*m*, a polymer resin is applied to the substrate in an over-molding step. In some embodiments the polymer resin is a transparent urethane rubber material, e.g., CLEAR FLEX™ manufactured by Smooth-On Inc. of Macungie, Pennsylvania, that is comprised of two component polymers mixed together in a predetermined ratio (e.g., 1A:2B). As shown in FIG. 1*m*, over molding of the polymer resin results in the SMCs 118 as well as the other sacrificial layer 104 being covered by the polymer resin. As described above, in some embodiments the polymer resin is transparent. In some embodiments, the assembled components are treated with ozone for a length of time to increase the bonding strength between the components and the compliant substrate 120. In some embodiments, the compliant substrate 120 is cured. In some embodiments, the polymer resin is flexible and stretchable. At this stage, the temporary rigid substrate—which includes the temporary rigid substrate 100, release layer 102 and sacrificial layer 104—is still affixed to the electronic components on a bottom side. The compliant substrate 120 is located opposite the temporary rigid substrate 100, affixed to the top side (as discussed in more detail below in the next step, the substrate is flipped wherein the top side becomes the bottom side).

In the step shown in FIG. 1*n*, the temporary rigid substrate 100 is separated from the electrical device (e.g., SMCs 118 and conductive traces) at the interface between the release layer 102 and the sacrificial layer 104, wherein the sacrificial layer 104 remains affixed to the compliant substrate 120. The process of separating the compliant substrate 120 from the temporary rigid substrate 100 is dry i.e., no solvent is necessary to make the separation. This separation relies on a differential interfacial adhesion between PMMA and PI materials. A first adhesion force between the PMMA material forming the release layer 102 and the silicon material forming the temporary rigid substrate 100 is stronger than a second adhesion force of the PI material forming the sacrificial layer 104 to the PMMA material forming the release layer 102. When a removal force greater than the second adhesion force is applied to the compliant substrate 120 it detaches from the temporary rigid substrate 100 at the PMMA-PI interface. A single transfer step for the entire device/circuit is also scalable.

In the step shown in FIG. 1*o*, the sacrificial layer 104 is removed from by a plasma etching process. As shown at in FIG. 1*o*, the compliant substrate 120 is flipped upside down, wherein the plasma etching process removes the sacrificial layer 104 from the compliant substrate 120. Following the step shown in FIG. 1*o*, electrical contacts and traces are exposed on the (now) top side of the compliant substrate 120.

In the step shown in FIG. 1*p*, electrical contacts are established as a required and in the step shown in FIG. 1*q*, a polymer layer 122 is deposited on top of the device to fully encapsulate the device. The final device is shown in FIG. 1*r*.

In this way, the method described above utilizes a rigid substrate to pattern and place electrical components in the density required utilizing microfabrication techniques. Following fabrication of the device the temporary rigid substrate is removed and the device is encapsulated in a stretchable silicone substrate.

Figure 2B:
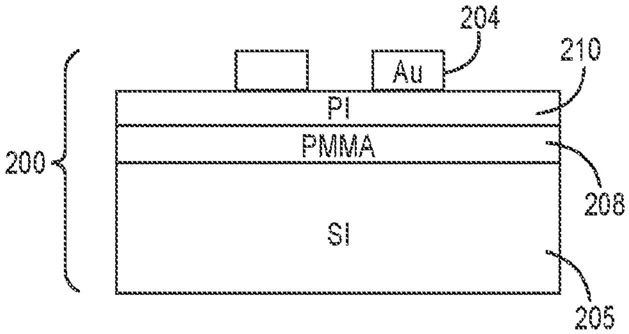
FIG. 2b is a side view of the rigid substrate, detachment layer, sacrificial layer, and electrical trace layer according to some embodiments.
Figure 2D:
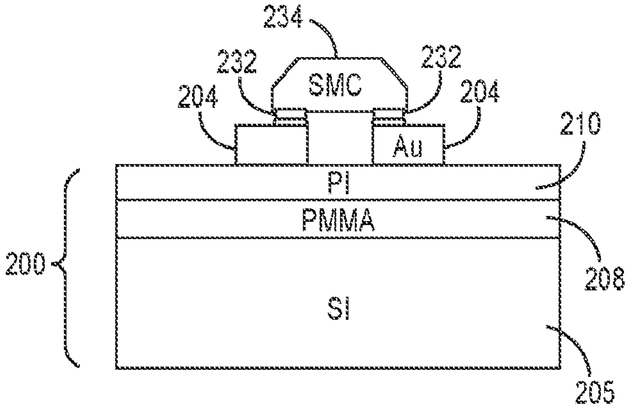
FIG. 2d is a side view of the rigid substrate shown in FIG. 2c that includes at least one SMC.
Figure 2F:
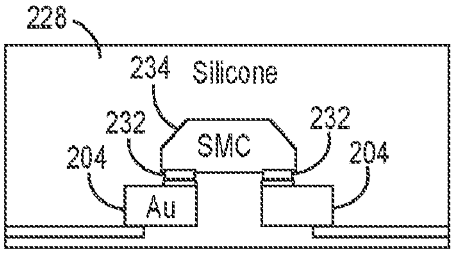
FIG. 2f is a side view of the flexible and stretchable electronic device according to some embodiments.
Figure 2A:
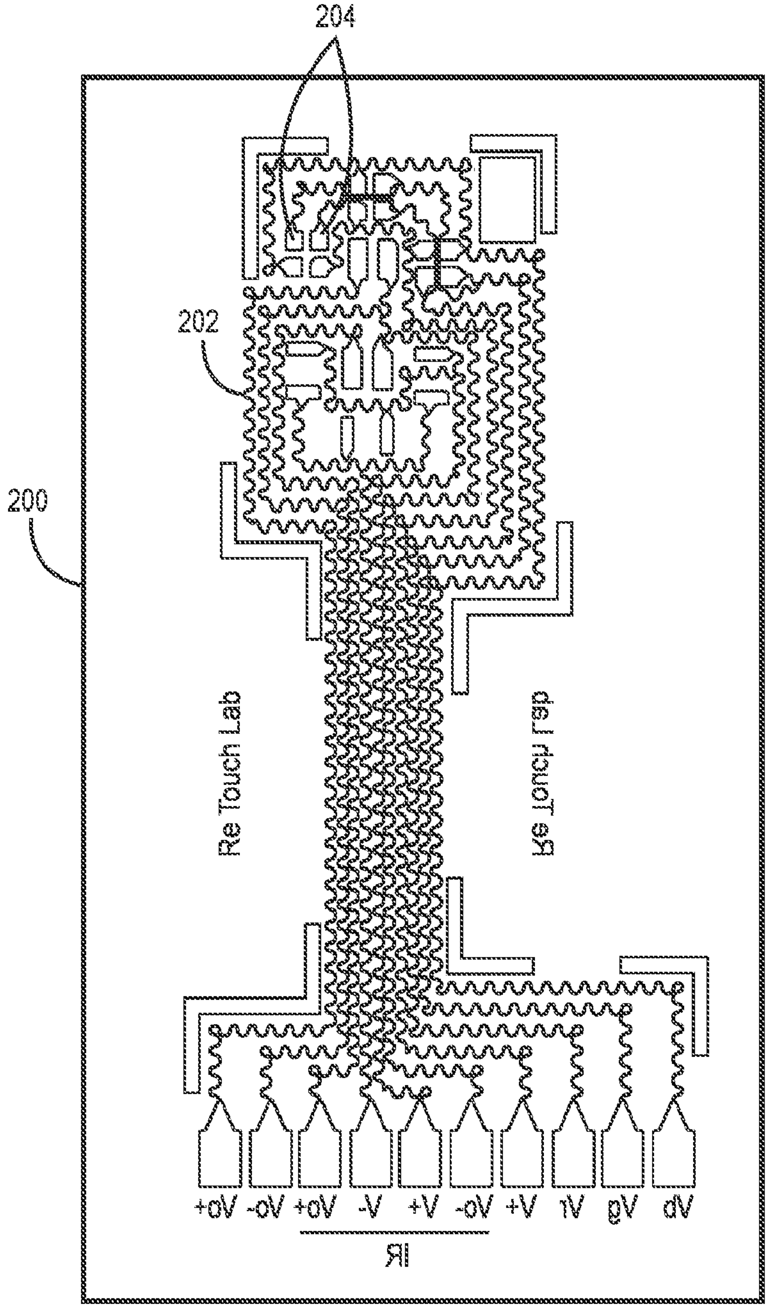
FIG. 2a is a top view of electrical traces fabricated on a rigid substrate according to some embodiments.

Referring now to FIGS. 2*a*-2*f*, the flexible and stretchable electronic device is illustrated at several different stages of manufacture as well as in operation. FIG. 2*a* is a top view of electrical traces fabricated on a temporary rigid substrate according to some embodiments. In this view, a temporary rigid substrate 200 supports a plurality of conductive traces 202 as well as a plurality of electrical contacts 204. As discussed above, utilization of a rigid substrate allows traditional microfabrication techniques to be utilized, allowing for density of conductive traces 202 and density of electrical contacts 204 not possible without microfabrication techniques. In the embodiment shown in FIG. 2*a*, conductive traces 202 have a geometry designed to accommodate stretching and/or bending of the device.

Figure 2C:
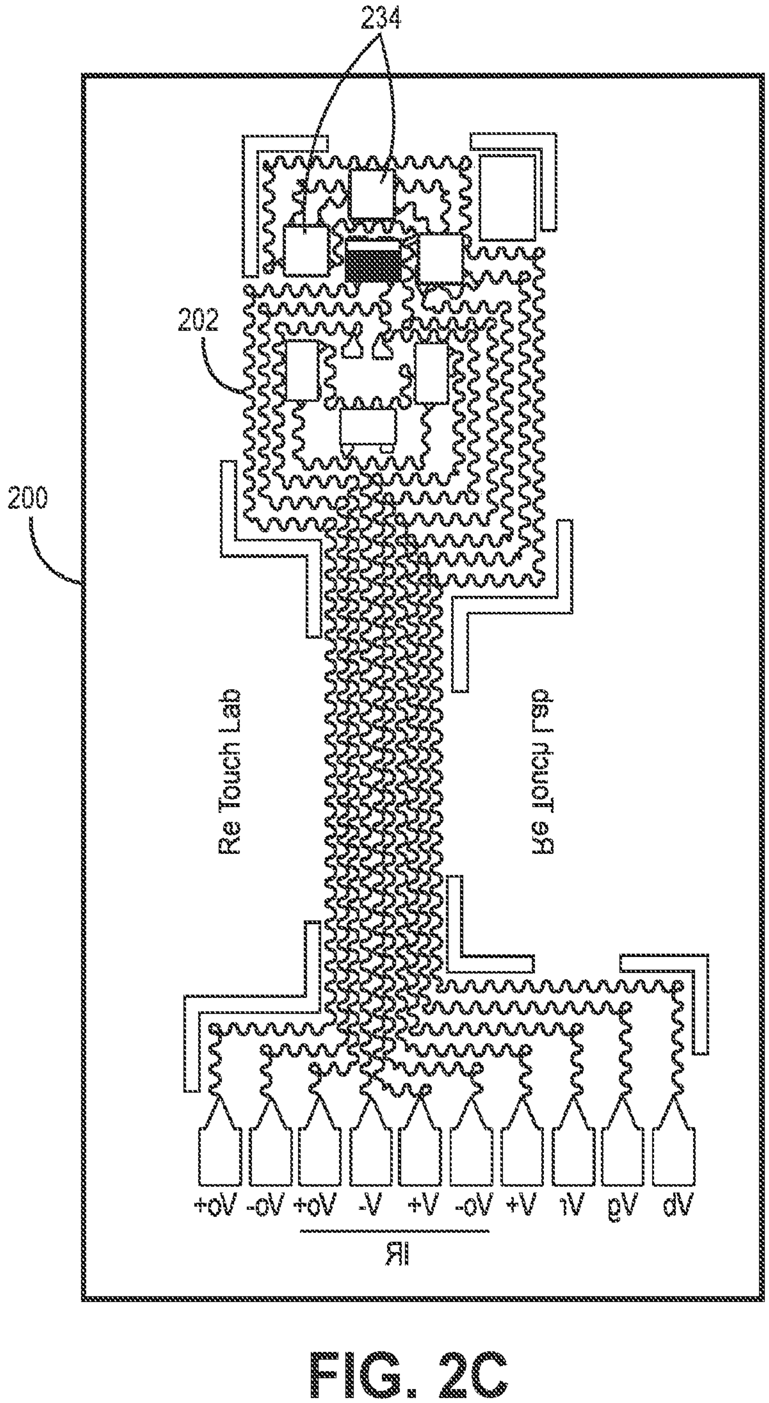
FIG. 2c is a top view of the rigid substrate that includes one or more surface mounted components (SMCs)

FIG. 2*b* is a side view of the device shown in FIG. 2*a*, in which a temporary rigid substrate 200 includes a rigid silicon substrate 205, a release layer 208 (e.g., PMMA) and a sacrificial layer 210 (e.g., PI). As described above, the release layer 208 and the sacrificial layer 210 are cured to ensure that temporary rigid substrate 200 is sufficiently rigid to fabricate electrical traces and mount surface mounted components (SMCs) as shown in FIG. 2*c*. In this example, conductive traces 202 and electrical contacts 204 have been deposited and fabricated on top of the temporary rigid substrate 200.

FIG. 2*c* is a top view that illustrates a plurality of surface mounted components (SMCs) 234 that are mounted to the temporary rigid substrate 200 according to some embodiments. In this view, the temporary rigid substrate 200 provides support during the mounting and soldering of the plurality of SMCs 234 onto the electrical contacts 204 shown in FIGS. 2*a* and 2*b*. In some embodiments, placement of the plurality of SMCs 234 may take advantage of pick-and-place commonly utilized with microfabrication techniques.

FIG. 2*d* is a side view of the device shown in FIG. 2*c*, in which SMCs 234 are mounted on the electrical contacts 204. At this time, the temporary rigid substrate 200 provides the rigidity necessary to mount the SMCs 234 onto the electrical contacts. In some embodiments, pick and place machines are utilized to mount the plurality of SMCs 234 onto the desired electrical contacts 204. A benefit of utilizing a rigid substrate (i.e., the temporary rigid substrate 200) during this process is that it allows for standard microfabrication techniques—such as pick and place machines—to be utilized to fabricate the electronic device. As described above with respect to FIGS. 1*a*-1*r*, following placement of the surface mounted components on the electrical contacts 204, the temporary rigid substrate 200 is removed and the remaining components are encased in a flexible and stretchable polymer layer as shown in FIGS. 2*e* and 2*f*.

Figure 2E:
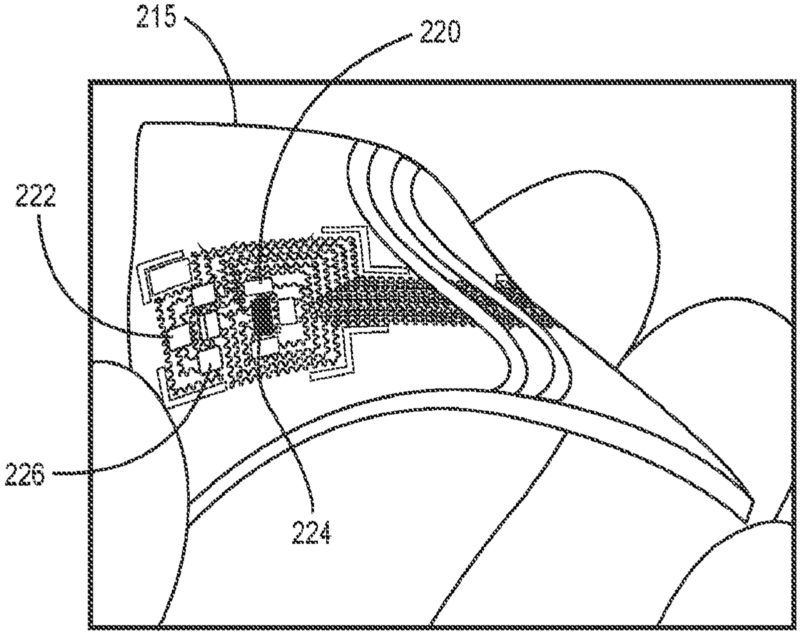
FIG. 2e is a perspective view of a flexible and stretchable electronic device.
Figure 2G:
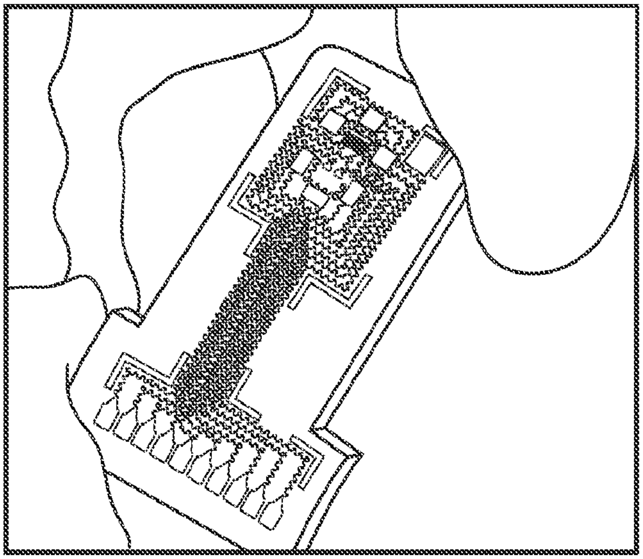
FIG. 2g is a perspective view of a transparent, flexible, and stretchable electronic device according to some embodiments.
Figure 2H:
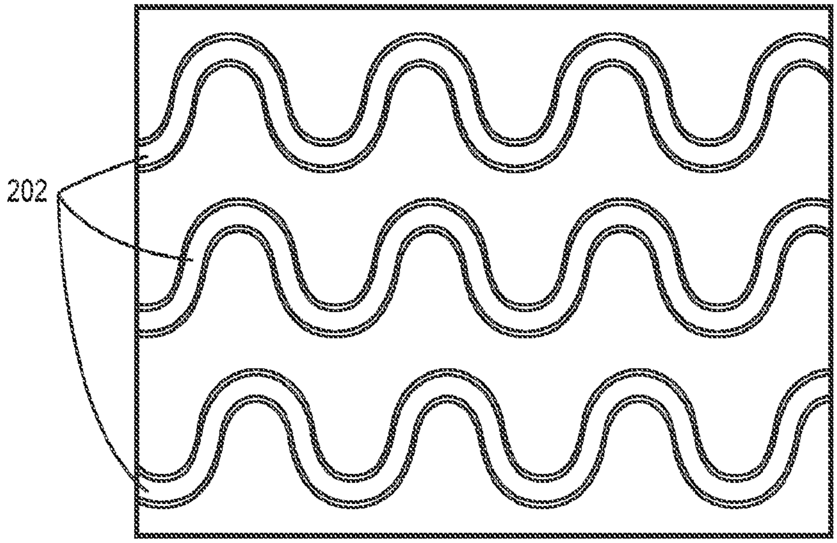
FIG. 2h is a perspective view of flexible conductive traces in transparent, flexible, and stretchable electronic device according to some embodiments.

With respect to FIG. 2*e*, an embodiment is shown in which the flexible and stretchable electronic device 215 includes a plurality of surface mounted optical devices. In particular, in the embodiment shown in FIG. 2*e*, the device includes an infrared (IR) LED 220, a red-green-blue (RGB) LED 222, an IR phototransistor 224, and a visible light phototransistor 226. Each of these components represents a type of surface mounted device (SMC) mounted onto the electrical contacts 204 shown in FIG. 2*a*. In addition, the embodiment shown in FIG. 2*e* illustrates a clear flexible and stretchable polymer substrate 228 surrounding the conductive traces 202 and SMR devices, including IR LED 220, RGB LED 222, IR phototransistor 224, and visible light phototransistor 226. As illustrated in FIG. 2*g*, the geometry of the conductive traces 202 (e.g., undulating, meandering, sawtooth, and/or serpentine geometry) allows the conductive traces 202 to handle bending and/or stretching. Likewise, the flexible and stretchable polymer substrate 228 is capable of handling bending and/or stretching. In addition, in applications in which one or more of the SMCs are optical devices requiring to transmit and/or receive transmitted light, it is important that the flexible and stretchable polymer substrate 228 be transparent or nearly transparent to allow the transmission of light to and from the optical devices.

FIG. 2*f* is a side view of the device shown in FIG. 2*e*. In the embodiment shown in FIG. 2*f*, the entire device is encapsulated in the flexible and stretchable polymer substrate 228. Encased within the flexible and stretchable polymer substrate 228 is a pair of electrical contacts 230*a*, 230*b*, a pair of solder joints 232*a*, 232*b*, and SMCs 234 (e.g., IR LED 220, RGB LED 222, IR phototransistor 224, or visible light phototransistor 226). The geometry of the conductive traces 202 ensures that the stretchability and flexibility of the device does not prevent electrical conductivity between the electrical contacts 230*a*, 230*b*, solder joints 232*a*, 232*b*, and the SMCs 234.

FIG. 2*g* is a perspective view illustrating the transparent and stretchable electrical device fabricated as shown in FIGS. 2*a*-2*f* in operation. In particular, the embodiment shown in FIG. 2*g* illustrates the use of optoelectronic devices, which can be utilized in a plurality of patient and health monitoring applications.

Although the embodiment shown in FIGS. 2*a*-2*e* utilizes a plurality of optoelectronic devices, in other embodiments various other configurations of optoelectronic devices and/or other electrical devices may be microfabricated on the flexible and stretchable substrate. For those applications that do not require transmission of light, the stretchable substrate is not required to be transparent.

While the invention has been described with reference to an exemplary embodiment(s), it will be understood by those skilled in the art that various changes may be made, and equivalents may be substituted for elements thereof without departing from the scope of the invention. In addition, many modifications may be made to adapt a particular situation or material to the teachings of the invention without departing from the essential scope thereof. Therefore, it is intended that the invention is not limited to the disclosed embodiment(s), but that the invention will include all embodiments falling within the scope of the appended claims.

The invention claimed is:

1. A method of manufacturing a stretchable electronic device, comprising:

depositing a release layer on a temporary rigid substrate;

depositing a sacrificial layer on the release layer;

fabricating a plurality of conductive traces and electrical contacts on top of the sacrificial layer;

mounting one or more surface mount components to the electrical contacts;

depositing a first stretchable polymer layer on top of the conductive traces and surface mount components to form a stretchable substrate;

separating the temporary rigid substrate and release layer from the sacrificial layer and the stretchable substrate at an interface between the release layer and the sacrificial layer;

removing the sacrificial layer from the stretchable substrate; and depositing a second stretchable polymer layer on a surface of the stretchable substrate exposed by removing the sacrificial layer.

2. The method of claim 1, wherein the first and second stretchable polymer layers are flexible.

3. The method of claim 1, wherein the first and second stretchable polymer layers are formed of a urethane rubber material.

4. The method of claim 1, wherein the release layer is formed of polymethyl methacrylate.

5. The method of claim 1, wherein the sacrificial layer is formed of polyimide.

6. The method of claim 1, wherein the sacrificial layer is removed from the first stretchable polymer layer by a plasma etching process.

7. The method of claim 1, wherein the temporary rigid substrate is formed of a silicon-based material.

8. The method of claim 1, wherein the first stretchable polymer layer is transparent.

9. The method of claim 8, wherein the one or more surface mount components are optoelectronic devices.

10. The method of claim 1, wherein the plurality of conductive traces is stretchable and flexible.

11. The method of claim 10, wherein the plurality of conductive traces has an undulating, meandering, sawtooth, or serpentine geometry.

12. A stretchable electronic device, comprising:

a plurality of conductive traces;

one or more electrical contacts in electrical communication with the plurality of conductive traces;

a plurality of optoelectronic devices, including a photo generation device and a photo detector device, mounted to the one or more electrical contacts; and a stretchable substrate surrounding the plurality of conductive traces and the one or more surface mounted components.

13. The stretchable electronic device of claim 12, wherein the stretchable substrate is flexible.

14. The stretchable electronic device of claim 12, wherein the plurality of conductive traces is stretchable.

15. The stretchable electronic device of claim 12, wherein the plurality of conductive traces is flexible.

16. The stretchable electronic device of claim 15, wherein the plurality of conductive traces has an undulating, meandering, sawtooth, or serpentine geometry.

17. The stretchable electronic device of claim 12, wherein the stretchable substrate is transparent.

18. A stretchable electronic assembly, comprising:

two stretchable electronic devices, each comprising:

a plurality of conductive traces;

one or more electrical contacts in electrical communication with the plurality of conductive traces;

one or more surface mounted components mounted to the one or more electrical contacts; and a stretchable substrate surrounding the plurality of conductive traces and the one or more surface mounted components, wherein the two stretchable electronic devices are stacked on one another and wherein conductive traces in the two stretchable electronic devices are connected by one or more conductive vias extending between the two stretchable electronic devices.

* * * * *